(12) United States Patent
Choi

(10) Patent No.: US 8,963,130 B2
(45) Date of Patent: Feb. 24, 2015

(54) TRANSPARENT ELECTRODE AND ORGANIC LIGHT EMITTING DIODE DEVICE INCLUDING THE TRANSPARENT ELECTRODE AND METHOD OF MANUFACTURING THE SAME

(75) Inventor: Jong-Hyun Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 218 days.

(21) Appl. No.: 13/108,457

(22) Filed: May 16, 2011

(65) Prior Publication Data
US 2012/0168755 A1 Jul. 5, 2012

(30) Foreign Application Priority Data

Dec. 30, 2010 (KR) ........................ 10-2010-0139431

(51) Int. Cl.
| | | |
|---|---|---|
| H01L 29/08 | (2006.01) | |
| H01L 35/24 | (2006.01) | |
| H01L 51/00 | (2006.01) | |
| H01L 29/04 | (2006.01) | |
| H01L 29/10 | (2006.01) | |
| H01L 31/00 | (2006.01) | |
| H01J 1/62 | (2006.01) | |
| H01J 63/04 | (2006.01) | |
| H01L 27/12 | (2006.01) | |
| H01L 51/52 | (2006.01) | |

(52) U.S. Cl.
CPC .......... *H01L 27/124* (2013.01); *H01L 51/5215* (2013.01); *H01L 51/5265* (2013.01); *H01L 2227/323* (2013.01)

USPC ............................ 257/40; 257/59; 313/504

(58) Field of Classification Search
None
See application file for complete search history.

(56) References Cited

U.S. PATENT DOCUMENTS

| | | | | |
|---|---|---|---|---|
| 2002/0136905 | A1* | 9/2002 | Medwick et al. ............. | 428/432 |
| 2008/0218058 | A1* | 9/2008 | Son ................................ | 313/500 |
| 2008/0315763 | A1* | 12/2008 | Dobbertin et al. ............ | 313/512 |
| 2009/0039353 | A1* | 2/2009 | Jun et al. ......................... | 257/72 |
| 2009/0126791 | A1* | 5/2009 | Lu et al. ....................... | 136/258 |
| 2010/0003511 | A1* | 1/2010 | So ................................. | 428/336 |
| 2010/0311103 | A1* | 12/2010 | Boukherroub et al. ......... | 435/29 |
| 2011/0001423 | A1 | 1/2011 | Natori et al. | |

(Continued)

FOREIGN PATENT DOCUMENTS

| | | |
|---|---|---|
| JP | 07-278791 | 10/1995 |
| KR | 10-2006-0009945 | 2/2006 |

(Continued)

OTHER PUBLICATIONS

Bertran et al., RF sputtering deposition of Ag/ITO coatings at room temperature, Solid State Ionics 165 (2003) pp. 139-148. Cited in Korean Office Action issued Jun. 27, 2012 in connection with Korean Patent Serial No. 10-2010-0139431.

(Continued)

*Primary Examiner* — Michael Jung
(74) *Attorney, Agent, or Firm* — Robert E. Bushnell, Esq.

(57) ABSTRACT

Disclosed are a transparent electrode including a first light-transmission layer, a metal layer, and a second light-transmission layer sequentially formed, an organic light emitting device including the transparent electrode, and a method of manufacturing the same. The second light-transmission layer includes a conductive oxide and a metal catalyst.

12 Claims, 17 Drawing Sheets

(56) References Cited

U.S. PATENT DOCUMENTS

2011/0100446 A1* 5/2011 Krasnov .................. 136/256
2011/0114956 A1* 5/2011 Park et al. .................. 257/59

FOREIGN PATENT DOCUMENTS

| KR | 10-2007-0021342 | 2/2007 |
| KR | 10-2007-0063067 | 6/2007 |
| KR | 1020090091175 | 8/2009 |
| KR | 1020100055235 | 5/2010 |
| KR | 1020100108623 | 10/2010 |

OTHER PUBLICATIONS

Kim et al., Investigation of conductive and transparent ITO/Ni/ITO multilayer films deposited by a magnetron sputter process, Nucl Instrum Meth B 268 (2010) pp. 131-134. Cited in Korean Office Action issued Jun. 27, 2012 in connection with Korean Patent Application Serial No. 10-2010-0139431.

* cited by examiner

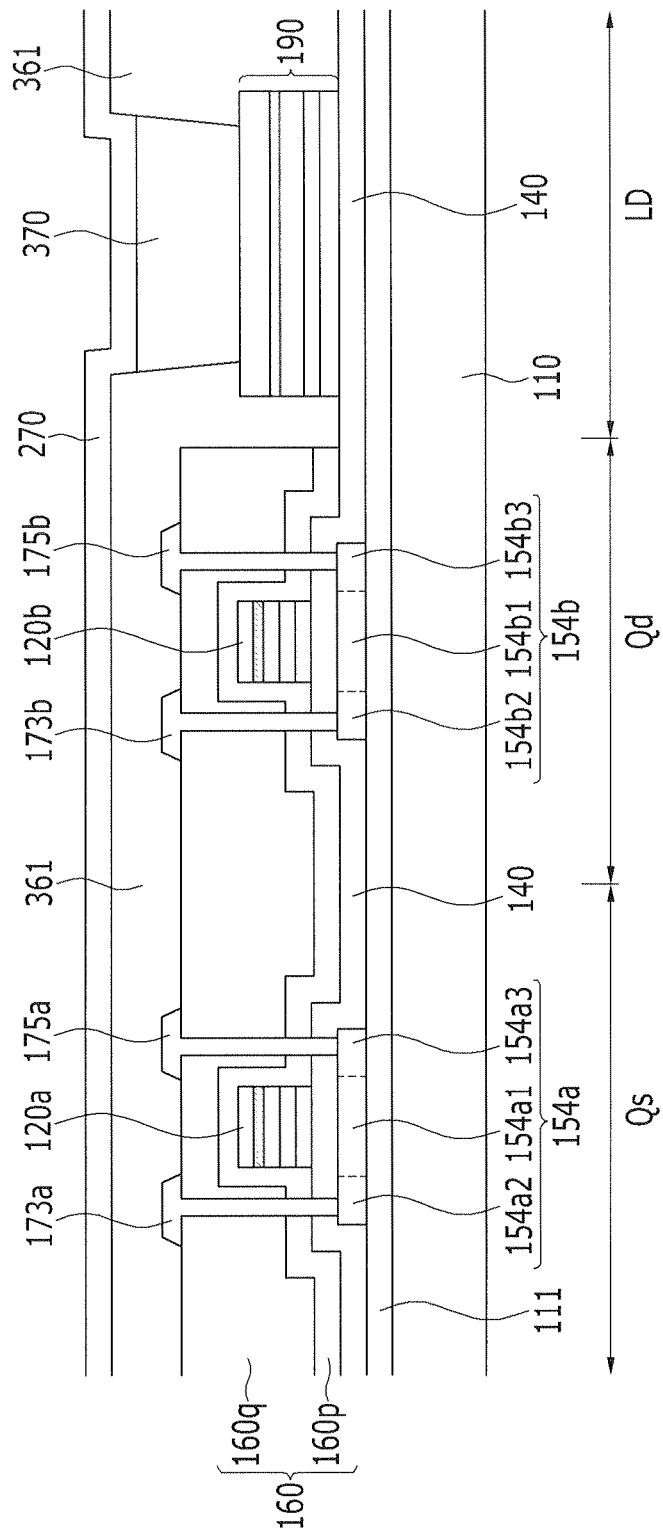

TRANSPARENT ELECTRODE AND ORGANIC LIGHT EMITTING DIODE DEVICE INCLUDING THE TRANSPARENT ELECTRODE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 30 Dec. 2010 and there duly assigned Serial No. 10-2010-0139431.

BACKGROUND OF THE INVENTION

1. Field of the Invention

This disclosure is related to a transparent electrode, an organic light emitting diode device including the transparent electrode, and a method of manufacturing the same.

2. Description of the Related Art

Recently, an organic light emitting diode device (OLED device) has been paid attention to as a display device and an illumination device.

An organic light emitting diode device in general includes two electrodes and an emission layer disposed therebetween and emits light when electrons injected from one electrode are combined with holes injected from the other electrode and thus, forms excitons and releases energy.

Herein, at least either of the two electrodes may be a transparent electrode that may externally emit light.

The transparent electrode may include a conductive oxide such as indium tin oxide (ITO), indium zinc oxide (IZO), and the like. The conductive oxide becomes crystalline during the process and thus, may form a pin hole in a predetermined region of the transparent electrode. The pin hole may play a role of being a passage for a chemical solution such as an etchant and the like flown inside the transparent electrode during the subsequent process, resulting in display defects.

SUMMARY OF THE INVENTION

An exemplary aspect of the present invention provides a transparent electrode that prevents display defects.

Another aspect of the present invention provides an organic light emitting device including the transparent electrode.

Yet another aspect of the present invention provides a method of manufacturing an organic light emitting device.

According to one embodiment, a transparent electrode is provided that includes a first light-transmission layer, a metal layer formed on the first light-transmission layer, and a second light-transmission layer formed on the metal layer. The second light-transmission layer includes a conductive oxide and a metal catalyst.

The second light-transmission layer may include two conductive oxide layers including the conductive oxide and a metal catalyst layer positioned between the two conductive oxide layers and including the metal catalyst.

The second light-transmission layer may be a single layer including the conductive oxide and the metal catalyst.

The metal catalyst may include nickel (Ni), palladium (Pd), titanium (Ti), silver (Ag), gold (Au), aluminum (Al), tin (Sn), antimony (Sb), copper (Cu), cobalt (Co), molybdenum (Mo), tritium (Tr), ruthenium (Ru), rhodium (Rh), cadmium (Cd), platinum (Pt), or a combination thereof.

The metal layer may be thinner than the first and second light-transmission layers.

The metal layer may include silver (Ag), aluminum (Al), molybdenum (Mo), or an alloy thereof.

The first and second light-transmission layers may include indium tin oxide (ITO), indium zinc oxide (IZO), aluminum-doped zinc oxide (AZO), gallium indium zinc oxide (GIZO), zinc oxide (ZnO), or a combination thereof.

According to another embodiment, an organic light emitting device is provided that includes a substrate, a first electrode disposed on the substrate, an emission layer disposed on the first electrode, and a second electrode disposed on the emission layer. The first electrode may include a first light-transmission layer, a metal layer formed on the first light-transmission layer, and a second light-transmission layer formed on the metal layer. The second light-transmission layer may include a conductive oxide and a metal catalyst.

The second light-transmission layer may include two conductive oxide layers including the conductive oxide and a metal catalyst layer positioned between the two conductive oxide layers and including the metal catalyst.

The second light-transmission layer may be a single layer including the conductive oxide and the metal catalyst.

The metal catalyst may include nickel (Ni), palladium (Pd), titanium (Ti), silver (Ag), gold (Au), aluminum (Al), tin (Sn), antimony (Sb), copper (Cu), cobalt (Co), molybdenum (Mo), tritium (Tr), ruthenium (Ru), rhodium (Rh), cadmium (Cd), platinum (Pt), or a combination thereof.

The metal layer may include silver (Ag), aluminum (Al), molybdenum (Mo), or alloys thereof.

The first and second light-transmission layers may include indium tin oxide (ITO), indium zinc oxide (IZO), aluminum-doped zinc oxide (AZO), gallium indium zinc oxide (GIZO), zinc oxide (ZnO), or a combination thereof.

The organic light emitting device may further include a thin film transistor electrically connected to the first electrode. The thin film transistor may include a semiconductor layer including a source region, a channel region, and a drain region, a gate electrode overlapped with the channel region of the semiconductor layer, and a source electrode and a drain electrode respectively connected to the source region and the drain region of the semiconductor layer. The gate electrode may further include a first light-transmission layer, a metal layer, and a second light-transmission layer formed at the same layer as the first electrode. The second light-transmission layer may include a conductive oxide and a metal catalyst.

The organic light emitting device may further include a gate insulating layer disposed between the semiconductor layer and the gate electrode. The gate insulating layer may contact the first electrode.

The second electrode may be a reflective electrode.

According to yet another embodiment, a method of manufacturing an organic light emitting device is provided that includes forming a semiconductor layer on a substrate, forming a gate insulating layer on the semiconductor layer, sequentially laminating and patterning a first light-transmission layer, a metal layer, and a second light-transmission layer including a conductive oxide and a metal catalyst on the gate insulating layer to form a gate electrode and a first electrode, forming a source region, a channel region, and a drain region in the semiconductor layer, forming a source electrode and a drain electrode respectively connected to the source region and the drain region of the semiconductor layer, forming an emission layer on the first electrode, and forming a second electrode on the emission layer.

The second light-transmission layer may be formed by sequentially laminating a first conductive oxide layer, a metal catalyst layer, and a second conductive oxide layer.

The second light-transmission layer may be formed into a single layer by sputtering the conductive oxide and the metal catalyst together Accordingly, the transparent electrode made of a conductive oxide may have no pin hole and thus, prevent display defects.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 is a cross-sectional view showing one pixel in an organic light emitting device according to one embodiment;

DETAILED DESCRIPTION OF THE INVENTION

Figure 1:
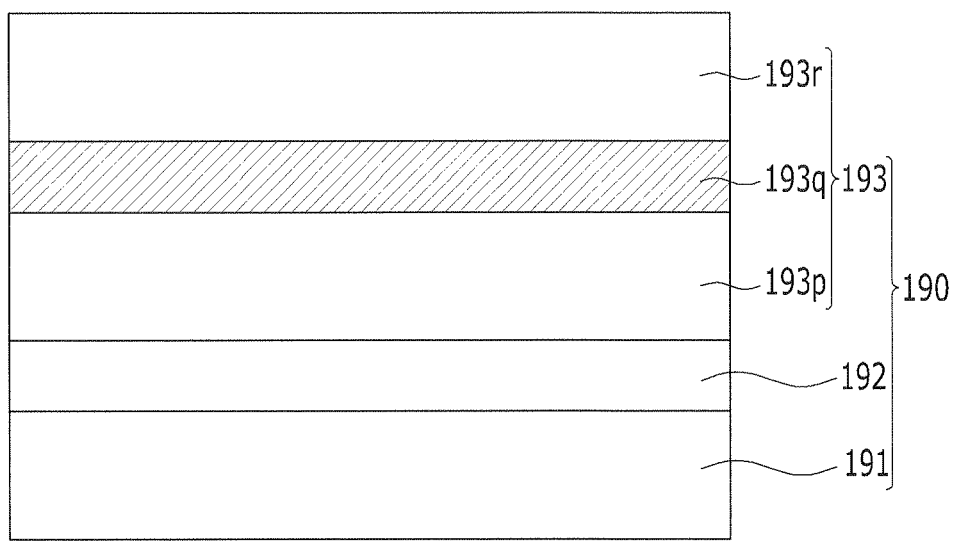
FIG. 1 is a cross-sectional view showing a transparent electrode according to one embodiment.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, illustrated is a transparent electrode according to one embodiment referring to FIG. 1.

FIG. 1 is a cross-sectional view showing a transparent electrode according to one embodiment.

Referring to FIG. 1, a transparent electrode 190 according to one embodiment includes a lower light-transmission layer 191, a metal layer 192, and an upper light-transmission layer 193.

The lower light-transmission layer 191 may be formed of a transparent conductive oxide such as indium tin oxide (ITO), indium zinc oxide (IZO), aluminum-doped zinc oxide (AZO), gallium indium zinc oxide (GIZO), zinc oxide (ZnO), or a combination thereof.

The metal layer 192 may be made of a thin metal and thus, has semi-transmission characteristic. For example, a metal with low resistance such as silver (Ag), aluminum (Al), molybdenum (Mo), or alloys thereof may be made to be about 20 Å to about 250 Å-thick. The metal layer 192 may improve conductivity of the transparent electrode 190 and thus, prevent a signal delay.

The upper light-transmission layer 193 may include two conductive oxide layers 193p and 193r and a metal catalyst layer 193q positioned between the two conductive oxide layers 193p and 93r.

The conductive oxide layers 193p and 193r may be formed of indium tin oxide (ITO), indium zinc oxide (IZO), aluminum-doped zinc oxide (AZO), gallium indium zinc oxide (GIZO), zinc oxide (ZnO), or a combination thereof.

The metal catalyst layer 193q is positioned between the conductive oxide layers 193p and 193r and may be formed of metal particles. The metal particle may include, for example, nickel (Ni), palladium (Pd), titanium (Ti), silver (Ag), gold (Au), aluminum (Al), tin (Sn), antimony (Sb), copper (Cu), cobalt (Co), molybdenum (Mo), tritium (Tr), ruthenium (Ru), rhodium (Rh), cadmium (Cd), platinum (Pt), or a combination thereof.

The upper light-transmission layer 193 includes a metal catalyst layer 193q between conductive oxide layers 193p and 193r to prevent corrosion of the metal layer 192 due to a chemical solution such as an etchant during the process. In particular, a conductive oxide such as indium tin oxide (ITO) or indium zinc oxide (IZO) for the lower and upper light-transmission layers 191 and 193 becomes crystalline during the process and thus, forms a plurality of grain boundaries in which a plurality of pin holes are generally generated. The pin holes may play a role of passing a chemical solution such as an etchant during the subsequent process. Thus, the chemical solution may contact with the lower layer and corrode a metal.

In the present embodiment, the transparent electrode 190 includes a metal catalyst layer 193q to prevent generation of a pin hole, resultantly preventing defects due to the pin holes during the process.

Hereinbefore, a metal catalyst is formed into a metal catalyst layer 193q as an upper light-transmission layer 193 between conductive oxide layers 193p and 193r. However, the upper light-transmission layer 193 may be formed into a single layer including a conductive oxide and a metal catalyst. When the upper light-transmission layer 193 is formed as a single layer, it may be prepared by co-sputtering a conductive oxide such as indium tin oxide (ITO) or indium zinc oxide (IZO) and a metal catalyst.

The metal catalyst may be included sufficiently enough to remove the pin holes, for example, in a concentration of about $1 \times 10^{13}$ atoms/□ to about $1 \times 10^{15}$ atoms/□.

The lower light-transmission layer 191, the metal layer 192, and the upper light-transmission layer 193 are sequentially laminated into a transparent electrode that entirely transmits a light. Herein, the metal layer 192 may be thinner than the lower and upper light-transmission layers 191 and 193. For example, the lower and upper light-transmission layers 191 and 193 may have a thickness ranging from about 50 Å to about 1000 Å. The metal layer 192 may have a thickness ranging from about 20 Å to about 250 Å.

Hereinafter, a transparent electrode according to another embodiment is illustrated referring to FIG. 2.

Figure 2:
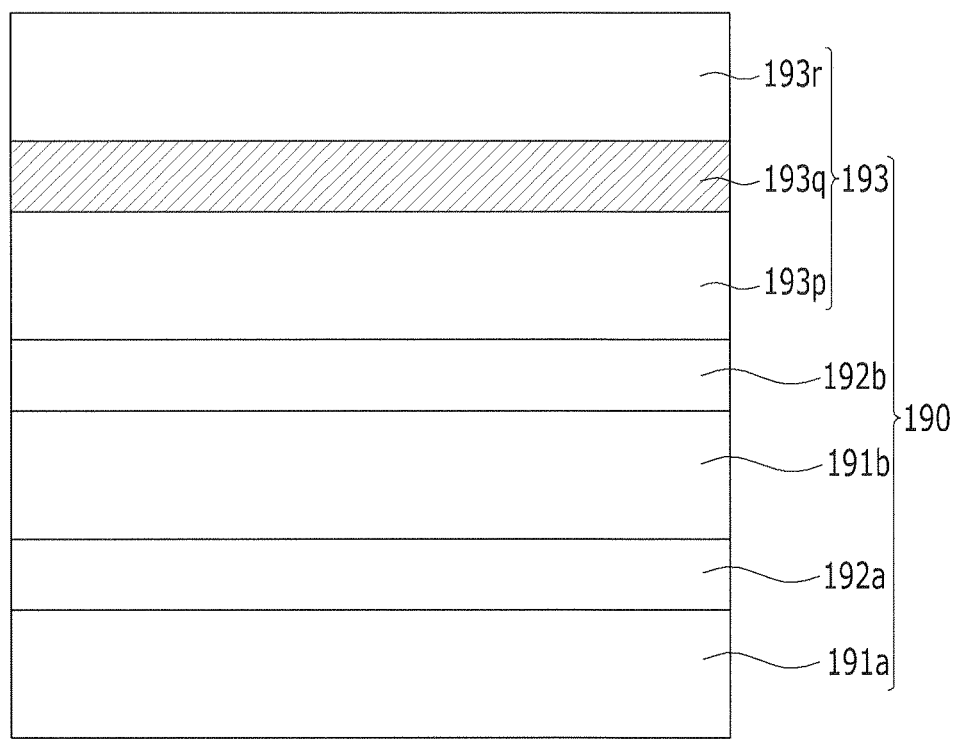
FIG. 2 is a cross-sectional view showing a transparent electrode according to another embodiment.

FIG. 2 is a cross-sectional view showing a transparent electrode according to another embodiment.

Referring to FIG. 2, the transparent electrode 190 according to the present embodiment includes a lower light-transmission layer 191a, a metal layer 192a, a lower light-transmission layer 191b, a metal layer 192b, and an upper light-transmission layer 193.

The lower light-transmission layers 191a and 191b may be formed of a transparent conductive oxide such as indium tin oxide (ITO), indium zinc oxide (IZO), aluminum-doped zinc oxide (AZO), gallium indium zinc oxide (GIZO), zinc oxide (ZnO), or a combination thereof.

The metal layers 192a and 192b may be thin enough and thus, have semi-transmission characteristic. For example, a metal with low resistance such as silver (Ag), aluminum (Al), molybdenum (Mo), or alloys thereof may be formed to be about 20 Å to about 250 Å thick. The metal layer 192 may improve conductivity of the transparent electrode 190 and thus, prevent a signal delay.

According to the embodiment, the lower light-transmission layers 191a and 191b and the metal layers 192a and 192b are twice laminated unlike the aforementioned embodiment. When the lower light-transmission layers 191a and 191b and the metal layers 192a and 192b are more than once laminated, the laminated product may be easily patterned.

In addition, the lower light-transmission layers 191a and 191b and the metal layers 192a and 192b may be more than 2 times laminated.

The upper light-transmission layer 193 may include two conductive oxide layers 193p and 193r and a metal catalyst layer 193q disposed between the two conductive oxide layers 193p and 193r as aforementioned.

The conductive oxide layers 193p and 193r may be formed of, for example, indium tin oxide (ITO), indium zinc oxide (IZO), aluminum-doped zinc oxide (AZO), gallium indium zinc oxide (GIZO), zinc oxide (ZnO), or a combination thereof.

The metal catalyst layer 193q may be positioned between the conductive oxide layers 193p and 193r and formed of metal particles. The metal particle may include, for example, nickel (Ni), palladium (Pd), titanium (Ti), silver (Ag), gold (Au), aluminum (Al), tin (Sn), antimony (Sb), copper (Cu), cobalt (Co), molybdenum (Mo), tritium (Tr), ruthenium (Ru), rhodium (Rh), cadmium (Cd), platinum (Pt), or a combination thereof.

Since the upper light-transmission layer 193 includes a metal catalyst layer 193q between the conductive oxide layers 193p and 193r as aforementioned, it may prevent corrosion of the metal layer 192 due to a chemical solution such as an etchant during the process.

Hereinafter, illustrated is an organic light emitting device including the transparent electrode referring to FIG. 3. FIG. 3 is a cross-sectional view showing one pixel in an organic light emitting device according to one embodiment.

According to one embodiment, an organic light emitting device may include a switching transistor region (Qs) including a switching thin film transistor, a driving transistor region (Qd) including a driving thin film transistor, and a light emitting region (LD) including an organic light emitting diode (OLED) in each pixel.

The switching thin film transistor has a control terminal, an input terminal, and an output terminal. The control terminal is connected to a gate line (not shown). The input terminal is connected to a data line (not shown). The output terminal is connected to a driving thin film transistor. The switching thin film transistor responds to a scan signal applied to the gate line and transfers the data signal to the driving thin film transistor.

The driving thin film transistor also has a control terminal, an input terminal, and an output terminal. The control terminal is connected to the switching thin film transistor. The input terminal is connected to a driving voltage line (not shown). The output terminal is connected to an organic light emitting diode (OLED). The driving thin film transistor may shed an output current ($I_{LD}$) with a different size depending on a voltage between the control and output terminals.

The organic light emitting diode (OLED) includes an anode connected to the output terminal of the driving thin film transistor and a cathode connected to a common voltage. The organic light emitting diode (OLED) emits a light depending on strength of the output current ($I_{LD}$) of the driving thin film transistor and displays an image.

Referring to FIG. 3, a buffer layer 111 is disposed on a transparent substrate 110 such as a glass substrate, a polymer layer, silicon wafer, or the like.

The buffer layer 111 may be made of, for example, silicon oxide, silicon nitride, or the like. It may play a role of preventing moisture or impurity generated from the transparent substrate 110 from moving up and controlling a heat delivery speed during the crystallization of the following semiconductor layer and thus, increasing its crystalline.

On the buffer layer 111, each semiconductor layer 154a and 154b is respectively formed on in the switching transistor region Qs and the driving transistor region Qd. The semiconductor layers 154a and 154b may include channel regions 154a1 and 154b1 and source regions 154a2 and 154b2 and drain regions 154a3 and 154b3 at both sides of the channel regions 154a1 and 154b1.

The semiconductor layers 154a and 154b may include a polycrystalline semiconductor. The source regions 154a2 and 154b2 and the drain regions 154a3 and 154b3 are doped with an n-type or p-type impurity.

Then, a gate insulating layer 140 is disposed on the semiconductor layers 154a and 154b.

On the gate insulating layer 140, a pixel electrode 190 is formed in the light emitting region LD. Each gate electrode 120a and 120b is respectively formed in the switching transistor region Qs and the driving transistor region Qd.

The pixel electrode 190 and the gate electrodes 120a and 120b may have a stacking structure having a plurality of layers.

Figure 4A:
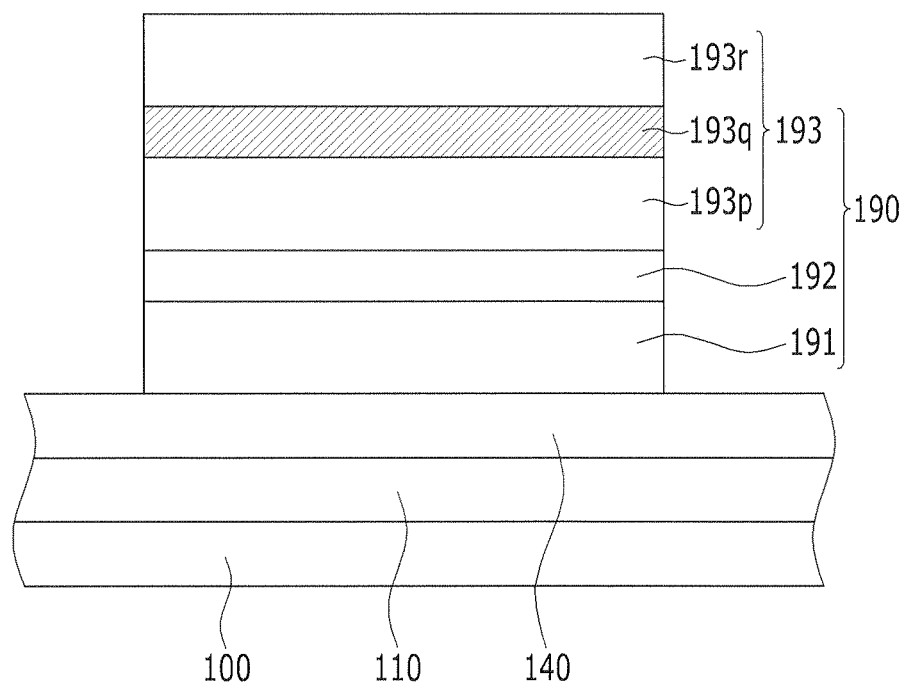
FIG. 4A is a cross-sectional view enlarging a pixel electrode in the organic light emitting device of FIG. 3.
Figure 4B:
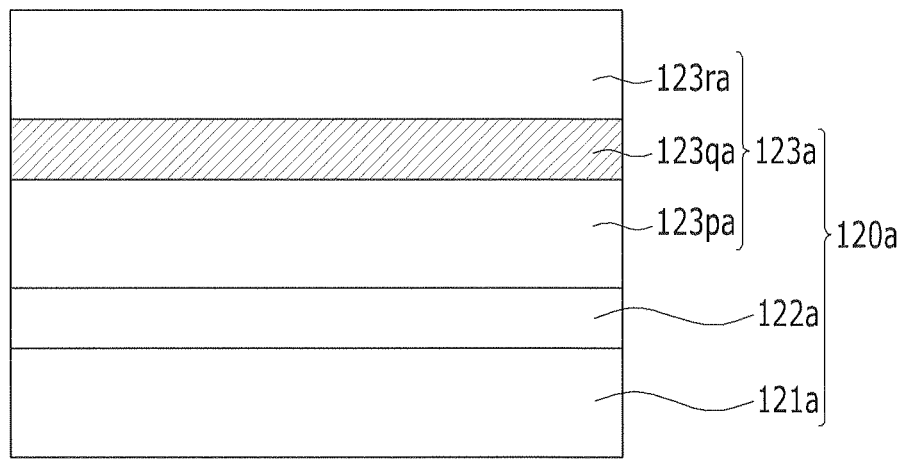
FIG. 4B is a cross-sectional view enlarging a gate electrode in a switching transistor region of the organic light emitting device in FIG. 3.
Figure 4C:
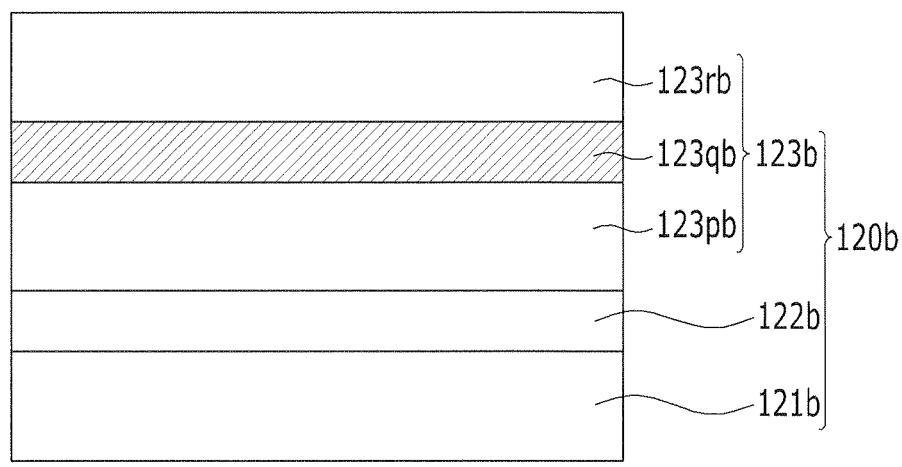
FIG. 4C is a cross-sectional view enlarging a gate electrode in a driving transistor region of the organic light emitting device in FIG. 3.

The stacking structure of the pixel electrode 190 and the gate electrodes 120a and 120b are illustrated referring to FIGS. 4A to 4C.

FIG. 4A is a cross-sectional view enlarging the pixel electrode 190 of the organic light emitting device in FIG. 3. FIG. 4B is a cross-sectional view enlarging the gate electrode 120a of the switching transistor region (Qs) in the organic light emitting device in FIG. 3. FIG. 4C is a cross-sectional view enlarging the gate electrode 120b of the driving transistor region (Qd) in the organic light emitting device in FIG. 3.

First of all, referring to FIG. 4A, the pixel electrode 190 may include a lower light-transmission layer 191, a metal layer 192, and an upper light-transmission layer 193.

The lower light-transmission layer 191 may be made of a transparent conductive oxide. The transparent conductive oxide may be made of, for example, indium tin oxide (ITO), indium zinc oxide (IZO), aluminum-doped zinc oxide (AZO), gallium indium zinc oxide (GIZO), zinc oxide (ZnO), or a combination thereof.

The metal layer 192 may be made of a thin metal and have semi-transmission characteristic. For example, a metal with low resistance such as silver (Ag), aluminum (Al), molybdenum (Mo), or alloys thereof may be made to be about 20 Å to about 250 Å thick. The metal layer 192 may improve conductivity of the pixel electrode 190 and prevent a signal delay.

The upper light-transmission layer 193 may include two conductive oxide layers 193p and 193r and a metal catalyst layer 193q positioned between the two conductive oxide layers 193p and 193r.

The conductive oxide layers 193p and 193r may include, for example, indium tin oxide (ITO), indium zinc oxide (IZO), aluminum-doped zinc oxide (AZO), gallium indium zinc oxide (GIZO), zinc oxide (ZnO), or a combination thereof.

The metal catalyst layer 193q may be positioned between conductive oxide layers 193p and 193r and formed of metal particles. The metal particles may include, for example, nickel (Ni), palladium (Pd), titanium (Ti), silver (Ag), gold (Au), aluminum (Al), tin (Sn), antimony (Sb), copper (Cu), cobalt (Co), molybdenum (Mo), tritium (Tr), ruthenium (Ru), rhodium (Rh), cadmium (Cd), platinum (Pt), or a combination thereof.

Since the upper light-transmission layer 193 includes a metal catalyst layer 193q between the conductive oxide layers 193p and 193r, it may prevent corrosion of the metal layer 192 due to a chemical solution such as an etchant.

For example, when the lower light-transmission layer 191, the metal layer 192, and the upper light-transmission layer 193 are sequentially laminated, a plurality of pin holes are generated in a conductive oxide when the lower and upper light-transmission layers 191 and 193 are formed. Herein, when the laminated lower light-transmission layer 191, metal layer 192, and upper light-transmission layer 193 are patterned by using an etchant etching all of them or an etchant etching each layer, the etching solution is flown in through the pin holes and corrodes the metal layer 192, resulting in display defects.

According to the embodiment, an upper light-transmission layer 193 includes a metal catalyst layer 193q and thus, decreases the number of pin holes and prevents an etchant from flowing into the metal layer 192.

Referring to FIGS. 4B and 4C, gate electrodes 120a and 120b are laminated through the same process as the pixel electrode 190 and patterned by using the same mask and thus, have the same stacking structure as the pixel electrode 190. Accordingly, the gate electrodes 120a and 120b may include lower light-transmission layers 121a and 121b, metal layers 122a and 122b, and upper light-transmission layers 123a and 123b. The specific illustration is the same as aforementioned. The upper light-transmission layer 123a includes two conductive oxide layers 123pa and 123ra and a metal catalyst layer 123qa positioned between the two conductive oxide layers 123pa and 123ra. The upper light-transmission layer 123b includes two conductive oxide layers 123pb and 123rb and a metal catalyst layer 123qb positioned between the two conductive oxide layers 123pb and 123rb.

Next, an insulation layer 160 is formed to cover gate electrodes 124a and 124b and a gate insulating layer 140 in the region except for the light emitting region LD. The insulation layer 160 may include a lower insulation layer 160p of an inorganic material and an upper insulation layer 160q made of an organic material. Either of the lower and upper insulation layer insulation layers 160p and 160q may be omitted.

The insulation layer 160 may have a plurality of contact holes exposing source regions 154a2 and 154b2 and drain regions 154a3 and 154b3 of semiconductor layers 154a and 154b but may be removed in the light emitting region LD thereof.

On the insulation layer 160, each source electrode 173a and 173b and each drain electrode 175a and 175b are respectively formed in the switching transistor region Qs and the driving transistor region Qd.

The source electrode 173a and the drain electrode 175a in the switching transistor region (Qs) are respectively connected to the source region 154a2 and the drain region 154a3 of the semiconductor layer 154a through a contact hole. The source electrode 173b and the drain electrode 175b in the driving transistor region Qd are respectively connected to the source region 154b2 and the drain region 154b3 of the semiconductor layer 154b through a contact hole.

Then, a partition 361 is formed on the whole of the substrate including source electrodes 173a and 173b and drain electrodes 175a and 175b. The partition 361 has an opening exposing a pixel electrode 190 in the light emitting region. LD.

Then, an organic emission layer 370 is formed on the pixel electrode 190 in the light emitting region LD.

The organic emission layer 370 may be formed of an organic material expressing a light such as red, green, blue, and the like and a white light by combining them. Then, an emitting auxiliary layer (not shown) may be formed on at least either of lower and upper organic emission layers 370. The light emitting auxiliary layer may be a hole injection layer HIL, a hole transport layer HTL, an electron injection layer EIL, and/or an electron transport layer ETL.

On the partition 361 and the organic emission layer 370, formed is a common electrode 270. The common electrode 270 may be made of a metal with a high reflectivity and may be a reflective electrode.

In the aforementioned organic light emitting device, either of the pixel electrode 190 and the common electrode 270 may be an anode. The other one may be a cathode. The anode and cathode as a pair may shed a current into an organic emission layer 370.

In addition, the pixel electrode 190 and the common electrode 270 may have a micro cavity structure. The microcavity structure may amplify a light with a particular wavelength region due to reinforcement interference, as a light repetitively reflects between a reflection layer with an optical length apart from a light and a (semi)transparent layer. According to the embodiment, a common electrode 270 may play a role of a reflective layer, while the pixel electrode 190 plays a role of a (semi)transparent layer. The optical length may be adjusted by changing a distance between the common electrode 270 and the pixel electrode 190 per each pixel.

The common electrode 270 may modify light emitting characteristic of an organic emission layer 370. A light around a wavelength corresponding to the resonance wavelength region of microcavity among the modified lights is reinforced through the pixel electrode 190 and emits toward the transparent substrate 110, while lights with other wavelength regions may be suppressed.

According to the embodiment, an organic light emitting device includes a pixel electrode 190 as a transparent electrode and a common electrode 270 as a reflective electrode and thus, has a bottom emission structure in which a light emitted from the emission layer 370 emits toward a substrate 110.

Hereinafter, illustrated is a method of manufacturing the aforementioned organic light emitting device referring to FIGS. 5 to 14 along with FIG. 3.

FIGS. 5 to 14 are a cross-sectional view sequentially showing a method of manufacturing the organic light emitting device in FIG. 3.

Figure 5:
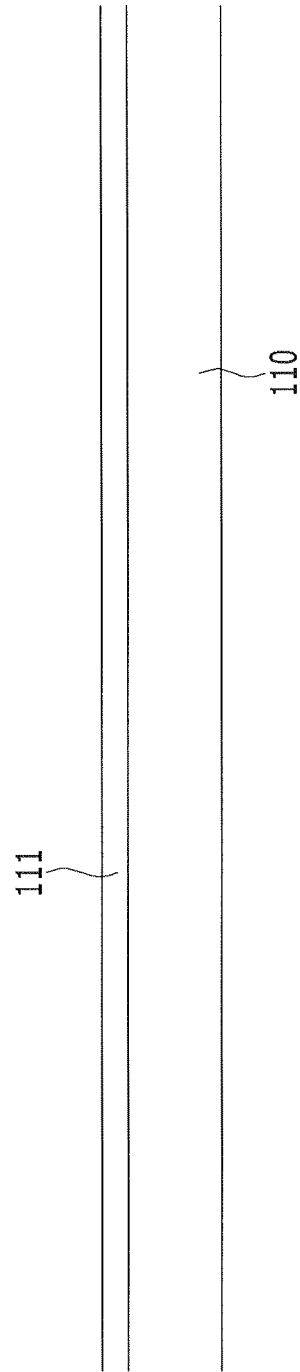
FIGS. 5 to 14 are a cross-sectional view sequentially showing a method of manufacturing the organic light emitting device in FIG. 3.

First of all, referring to FIG. 5, a buffer layer 111 is formed on a transparent substrate 110 by a chemical vapor deposition (CVD) method.

Figure 6:
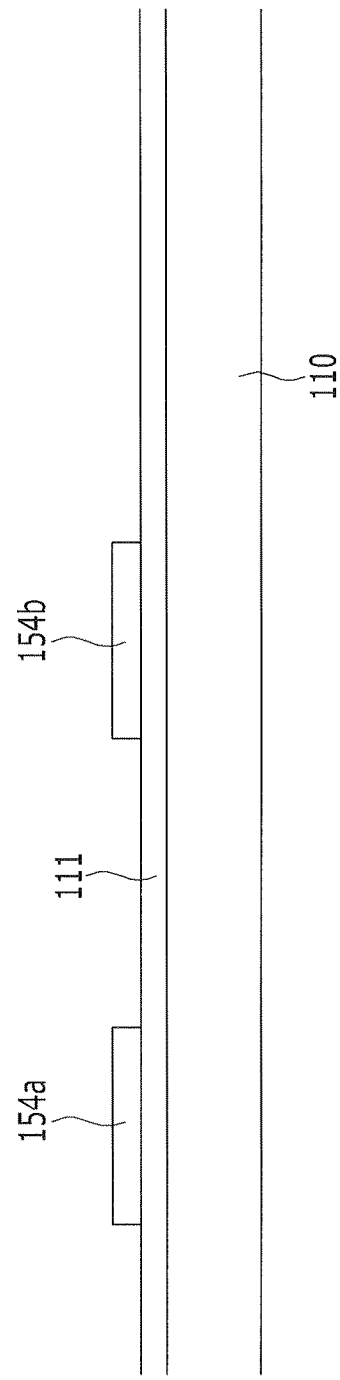

Next, referring to FIG. 6, an amorphous silicon layer is deposited on the buffer layer 111 by a chemical vapor deposition (CVD) or PVD method and crystallized. The crystallization may be performed in a method of, for example, excimer laser annealing (ELA), sequential lateral solidification (SLS), metal induced crystallization (MIC), metal induced lateral crystallization (MILC), super grain silicon (SGS), or the like.

The crystallized semiconductor layer is patterned to form semiconductor layers 154a and 154b.

Figure 7:
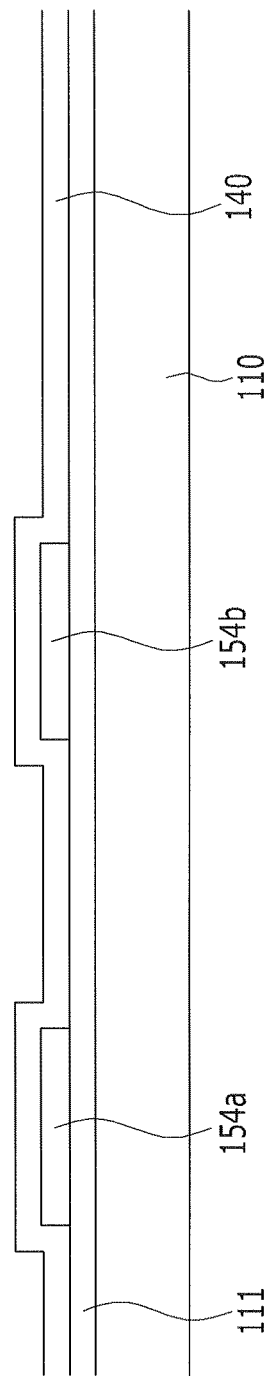

Then, referring to FIG. 7, a gate insulating layer 140 is formed on the whole of the substrate including semiconductor layers 154a and 154b.

Figure 8:
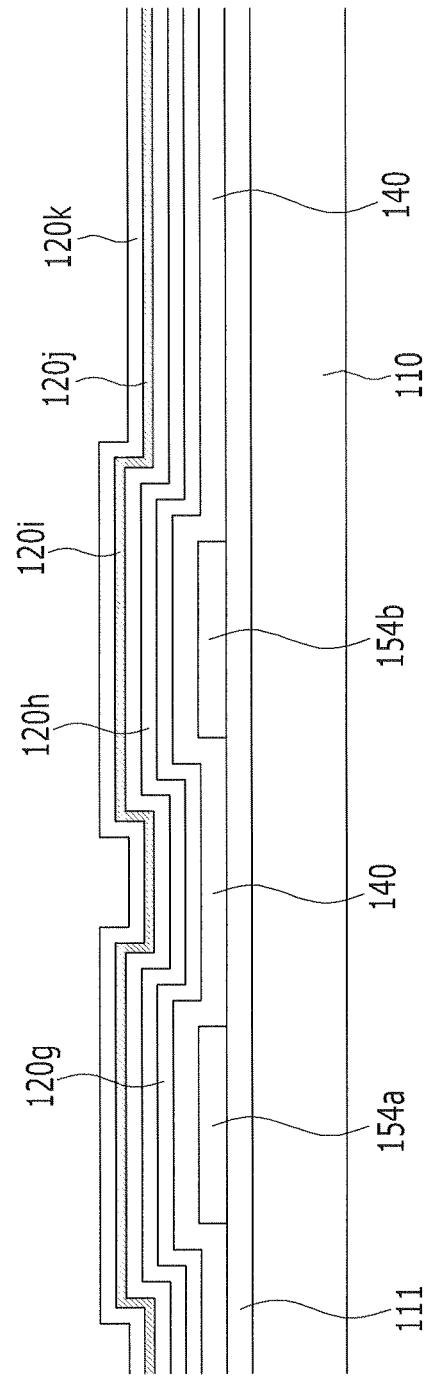

Referring to FIG. 8, a transparent conductive layer 120g, a metal layer 120h, a transparent conductive layer 120i, a metal catalyst layer 120j, and a transparent conductive layer 120k are sequentially laminated on the gate insulating layer 140.

Figure 9:
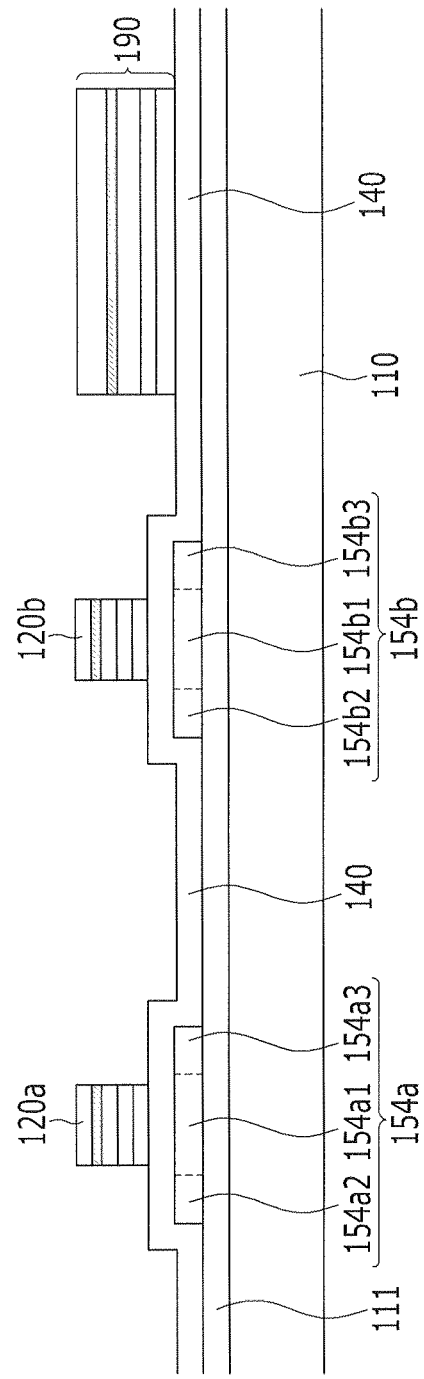

Referring to FIG. 9, the transparent conductive layer 120g, the metal layer 120h, the transparent conductive layer 120i, the metal catalyst layer 120j, and the transparent conductive layer 120k are etched all together by using an etchant to form gate electrodes 120a and 120b and a pixel electrode 190. However, the transparent conductive layer 120g, the metal layer 120h, the transparent conductive layer 120i, the metal catalyst layer 120j, and the transparent conductive layer 120k may be etched by using each etchant.

In addition, the gate electrodes 120a and 120b and the pixel electrode 190 may be formed by respectively laminating a transparent conductive layer 120i, a metal catalyst layer 120j, and a transparent conductive layer 120k or by co-sputtering a conductive oxide and a metal catalyst as a single transparent layer containing the metal catalyst.

Next, the gate electrodes 120a and 120b are used as a mask to inject n-type or p-type impurity into the semiconductor layers 154a and 154b and form source regions 154a2 and 154b2 and drain regions 154a3 and 154b3 doped with an impurity and channel regions 154a1 and 154b1 doped with no impurity.

Figure 10:
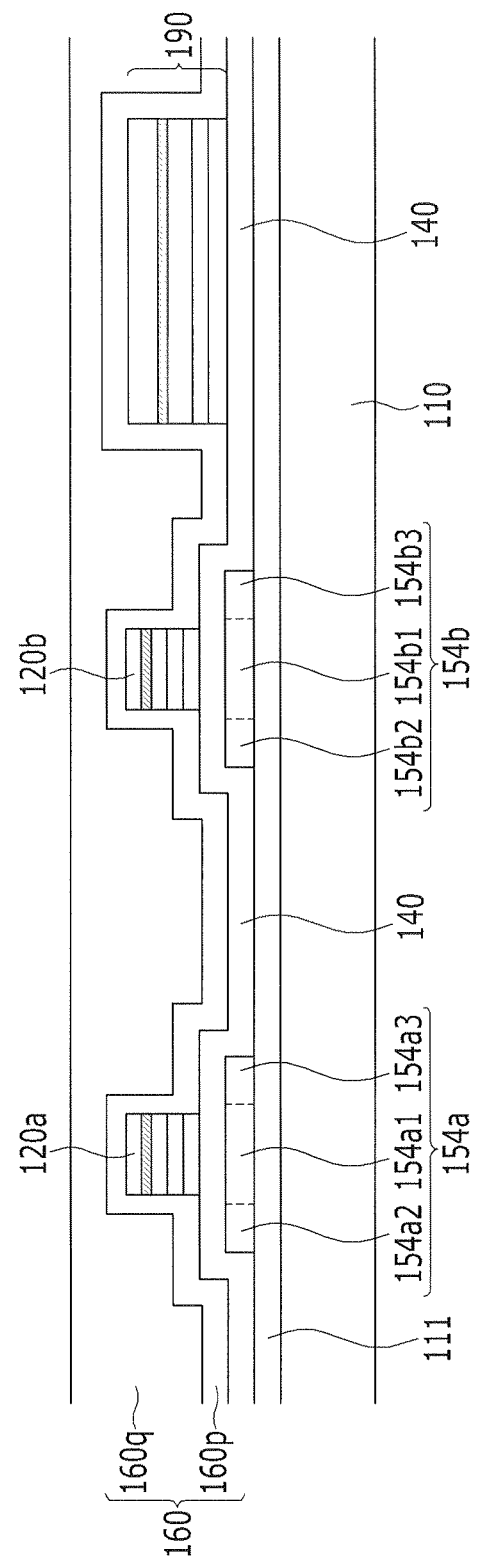

Referring to FIG. 10, an inorganic material is deposited on the whole of the substrate including the gate electrodes 120a and 120b to form a lower insulation layer 160p. Then, an organic material is coated on the lower insulation layer 160p to form an upper insulation layer 160q.

Figure 11:
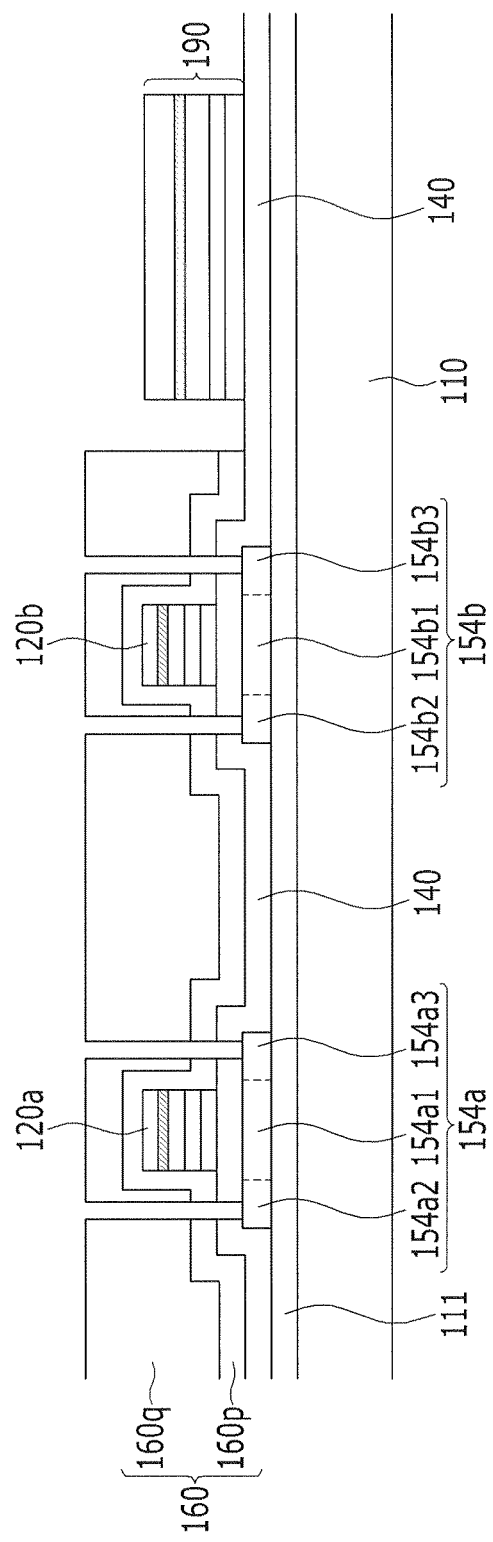

Referring to FIG. 11, the upper insulation layer 160q is patterned. Then, the lower insulation layer 160p and the gate insulating layer 140 are patterned to form a plurality of contact holes exposing the source regions 154a2 and 154b2 and drain regions 154a3 and 154b3 and simultaneously, exposing the pixel electrode 190.

Figure 12:
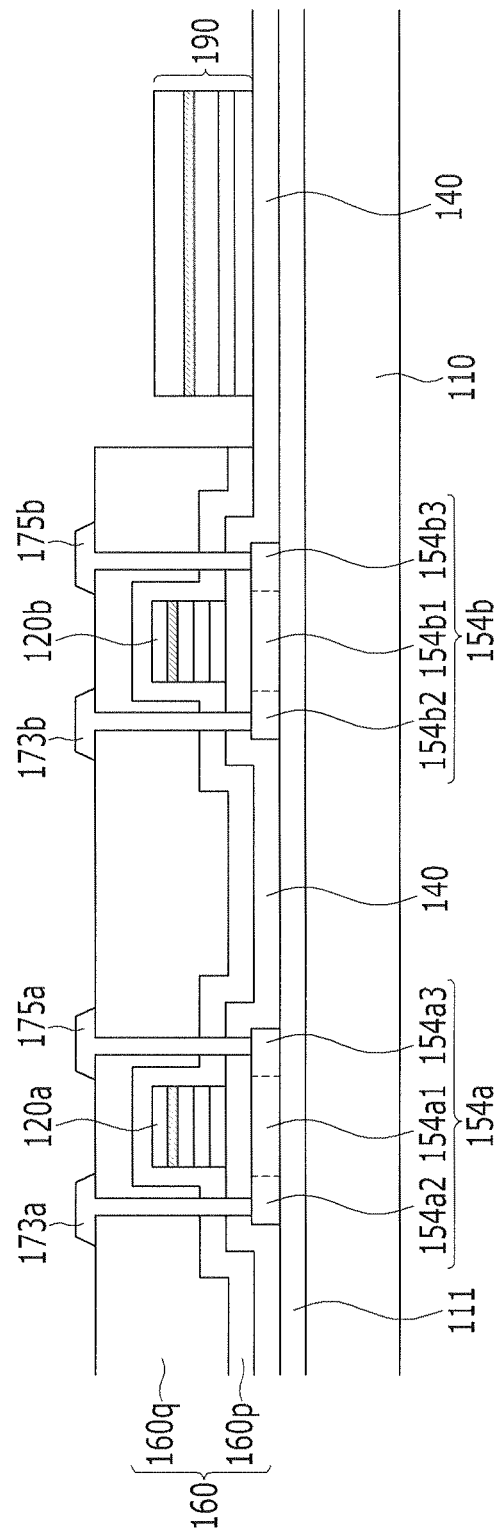

Referring to FIG. 12, a metal layer is laminated on the upper insulation layer 160q and then, patterned to form source electrodes 173a and 173b connected to the source regions 154a2 and 154b2 and drain electrodes 175a and 175b connected to the drain regions 154a3 and 154b3.

Figure 13:
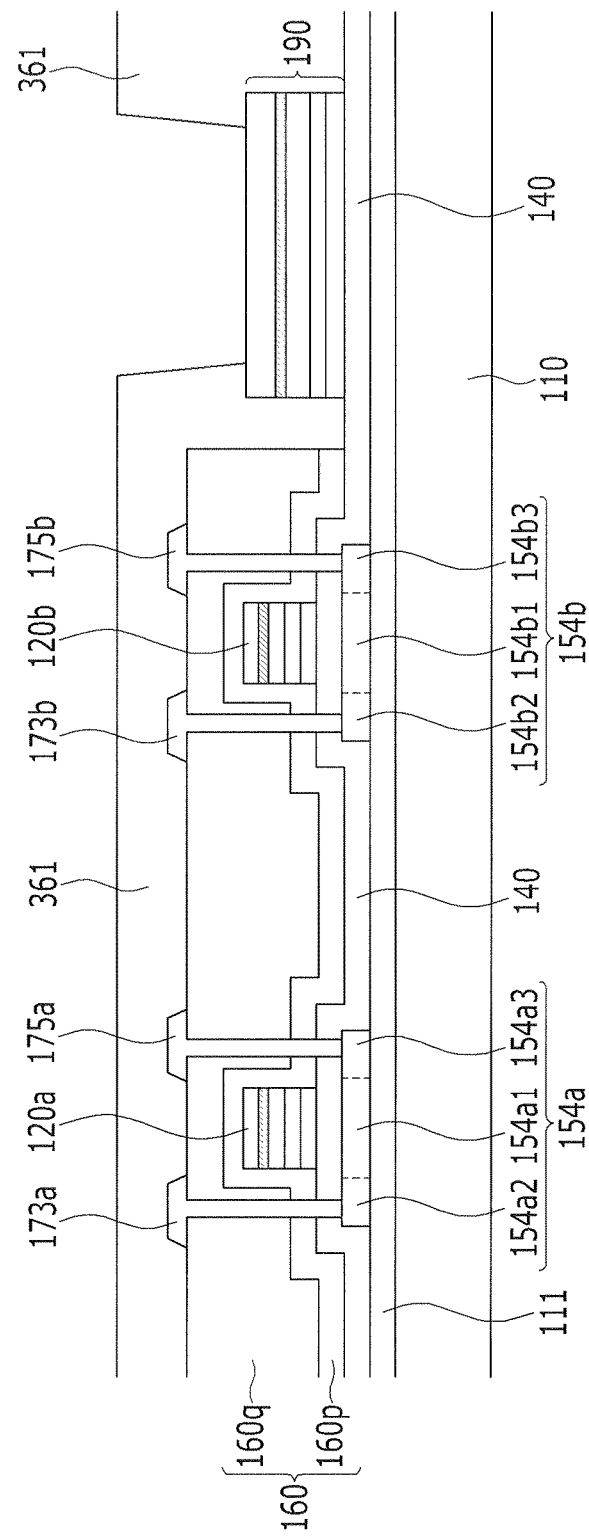

Referring to FIG. 13, a partition 361 is formed by coating an organic layer on the whole of the substrate and patterning it.

Figure 14:
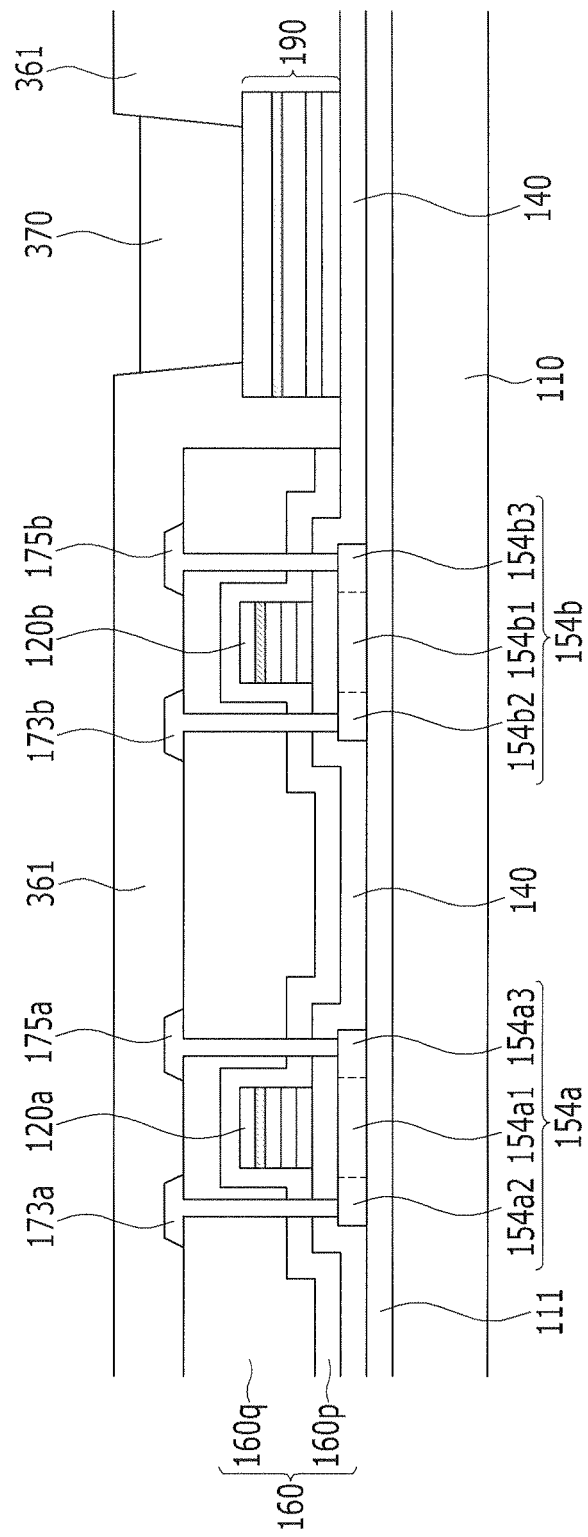

In FIG. 14, an organic emission layer 370 is disposed on the pixel electrode 190.

Referring to FIG. 3, a common electrode 270 is formed on the organic emission layer 370.

Hereinafter, the embodiments are illustrated in more detail with reference to examples. These examples, however, should not in any sense be interpreted as limiting the scope of the present invention.

EXAMPLE

Fabricated was a thin film transistor according to the aforementioned embodiment. Then, a pixel electrode was formed thereon by respectively laminating ITO/Ag/ITO/Ni/ITO to respectively have a thickness or a concentration of 70 Å, 150 Å, 150 Å, $1\times10^{15}$ atoms/cm$^2$, and 150 Å, respectively and then, patterned using a nitric acid-based etching solution to fabricate a transparent electrode.

Comparative Example

A thin film transistor and a transparent electrode were formed according to the same method as Example except for laminating 70 Å, 150 Å, and 300 Å thick ITO/Ag/ITO to form a pixel electrode.

Evaluation.

The thin film transistor and the transparent electrode fabricated according to Example and Comparative Example was evaluated regarding display characteristic.

Figure 15A:
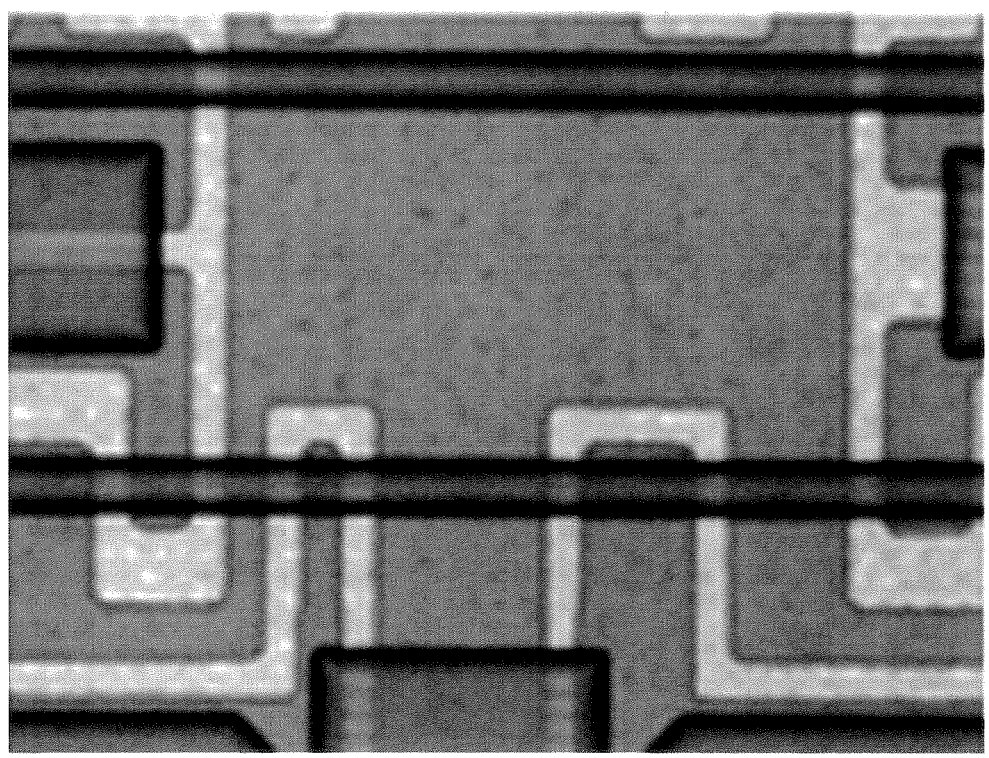
FIG. 15A is a photograph showing a thin film transistor and the pattern of a transparent electrode according to Example.
Figure 15B:
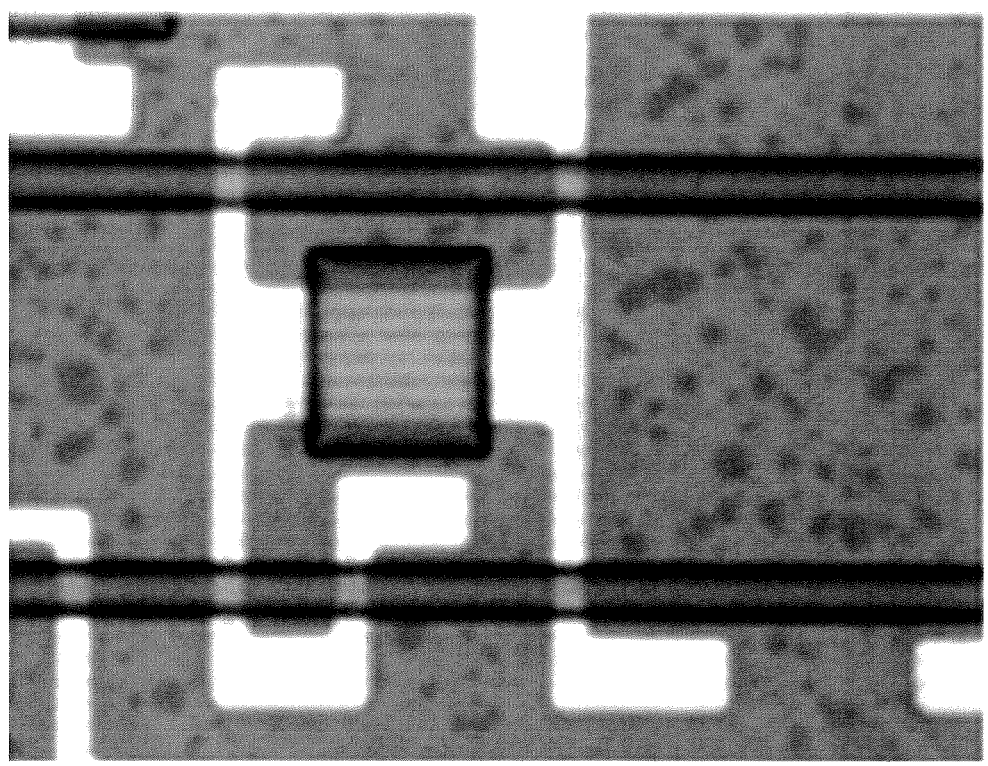
FIG. 15B is a photograph showing a thin film transistor and the pattern of a transparent electrode according to Comparative Example.

FIG. 15A is a photograph showing the pattern of the thin film transistor and the transparent electrode according to Example. FIG. 15B is a photograph showing the pattern of the thin film transistor and the transparent electrode Comparative Example.

Referring to FIGS. 15A and 15B, the transparent electrode according to Example had remarkably less stains due to damage on a metal layer (Ag) than the transparent electrode according to Comparative Example.

Accordingly, the transparent electrode of Example had improved display characteristic.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising
a substrate;
a first electrode disposed on the substrate;
an emission layer disposed on the first electrode; and
a second electrode disposed on the emission layer, the first electrode comprising a first light-transmission layer, a metal layer disposed on the first light-transmission layer, and a second light-transmission layer disposed on the metal layer, the second light-transmission layer of the first electrode comprising a conductive oxide and a metal catalyst, the second light-transmission layer of the first electrode directly contacting the metal layer of the first electrode.

2. The organic light emitting device of claim 1, wherein the second light-transmission layer comprises:
two conductive oxide layers comprising the conductive oxide; and
a metal catalyst layer positioned between the two conductive oxides and comprising the metal catalyst.

3. The organic light emitting device of claim 1, wherein the second light-transmission layer is a single layer comprising the conductive oxide and the metal catalyst.

4. The organic light emitting device of claim 1, wherein the metal catalyst comprises nickel (Ni), palladium (Pd), titanium (Ti), silver (Ag), gold (Au), aluminum (Al), tin (Sn), antimony (Sb), copper (Cu), cobalt (Co), molybdenum (Mo), tritium (Tr), ruthenium (Ru), rhodium (Rh), cadmium (Cd), platinum (Pt), or a combination thereof.

5. The organic light emitting device of claim 1, wherein the metal layer comprises silver (Ag), aluminum (Al), molybdenum (Mo), or a combination thereof.

6. The organic light emitting device of claim 1, wherein the first light-transmission layer and the second light-transmission layer comprise indium tin oxide (ITO), indium zinc oxide (IZO), aluminum-doped zinc oxide (AZO), gallium indium zinc oxide (GIZO), zinc oxide (ZnO), or a combination thereof.

7. The organic light emitting device of claim 1, further comprising a thin film transistor electrically connected to the first electrode, wherein the thin film transistor comprises:
   a semiconductor layer having a source region, a channel region, and a drain region;
   a gate electrode overlapping with the channel region of the semiconductor layer; and
   a source electrode and a drain electrode respectively connected to the source region and the drain region, the gate electrode comprising a first light-transmission layer, a metal layer, and a second light-transmission layer, the second light-transmission layer of the gate electrode comprising a conductive oxide and a metal catalyst.

8. The organic light emitting device of claim 7, further comprising a gate insulating layer disposed between the semiconductor layer and the gate electrode, the gate insulating layer contacting the first electrode.

9. The organic light emitting device of claim 1, wherein the second electrode is a reflective electrode.

10. A method of manufacturing an organic light emitting device comprising
   forming a semiconductor layer on a substrate;
   forming a gate insulating layer on the semiconductor layer;
   forming a gate electrode and a first electrode on the gate insulating layer, the first electrode comprising a first light-transmission layer, a metal layer disposed on the first light-transmission layer, and a second light-transmission layer disposed on the metal layer, the second light-transmission layer of the first electrode comprising a conductive oxide and a metal catalyst the second light-transmission layer of the first electrode directly contacting the metal layer of the first electrode;
   forming a source region, a channel region, and a drain region in the semiconductor layer;
   forming a source electrode and a drain electrode respectively connected to the source region and the drain region of the semiconductor layer;
   forming an emission layer on the first electrode; and
   forming the second electrode on the emission layer.

11. The method of claim 10, wherein the second light-transmission layer is fabricated by sequentially laminating a first conductive oxide layer, a metal catalyst layer, and a second conductive oxide layer.

12. The method of claim 10, wherein the second light-transmission layer is formed into a single layer by sputtering the conductive oxide and the metal catalyst together.

* * * * *